(12) United States Patent
Liao et al.

(10) Patent No.: US 10,453,805 B2
(45) Date of Patent: Oct. 22, 2019

(54) PROTECTION STRUCTURE FOR SEMICONDUCTOR DEVICE PACKAGE

(71) Applicant: WIN Semiconductors Corp., Tao Yuan (TW)

(72) Inventors: Pei-Chun Liao, Tao Yuan (TW); Po-Wei Ting, Tao Yuan (TW); Chih-Feng Chiang, Tao Yuan (TW); Yu-Kai Wu, Tao Yuan (TW); Yu-Fan Chang, Tao Yuan (TW); Re-Ching Lin, Tao Yuan (TW); Shu-Hsiao Tsai, Tao Yuan (TW); Cheng-Kuo Lin, Tao Yuan (TW)

(73) Assignee: WIN SEMICONDUCTORS CORP., Tao Yuan (TW)

( * ) Notice: Subject to any disclaimer, the term of this patent is extended or adjusted under 35 U.S.C. 154(b) by 0 days.

(21) Appl. No.: 15/147,401

(22) Filed: May 5, 2016

(65) Prior Publication Data
US 2017/0162518 A1 Jun. 8, 2017

(30) Foreign Application Priority Data

Dec. 7, 2015 (TW) .............................. 104140984 A

(51) Int. Cl.
*H01L 23/00* (2006.01)
*H01L 25/16* (2006.01)
(Continued)

(52) U.S. Cl.
CPC .......... *H01L 23/562* (2013.01); *B81B 7/0077* (2013.01); *G01C 19/5783* (2013.01); *H01L 24/29* (2013.01); *H01L 25/162* (2013.01);
*H01L 25/165* (2013.01); *B81B 2201/0242* (2013.01); *B81B 2201/0271* (2013.01); *B81B 2207/07* (2013.01); *H01L 2224/29144* (2013.01); *H01L 2224/29147* (2013.01); *H01L 2225/06541* (2013.01)

(58) Field of Classification Search
CPC ... B81B 7/0058; H01L 23/562; H01L 25/162; H01L 25/165
See application file for complete search history.

(56) References Cited

U.S. PATENT DOCUMENTS 5,495,667 A * 3/1996 Farnworth ............... G01R 1/06
174/260
8,779,604 B1 * 7/2014 Cheng ..................... H01L 24/11
257/737

(Continued)

*Primary Examiner* — Raj R Gupta
(74) *Attorney, Agent, or Firm* — Muncy, Geissler, Olds & Lowe, P.C.

(57) ABSTRACT

A chip stack having a protection structure for semiconductor device package, which comprises a first chip and a second chip stacked with each other, wherein said first chip has a first surface, said second chip has a second surface, said first surface and said second surface are two surfaces facing to each other, wherein at least one metal pillar is formed on at least one of said first surface and said second surface and connected with the other, at least one protection ring is formed on at least one of said first surface and said second surface and having a first gap with the other, and at least one electrical device is formed on at least one of said first surface and said second surface, wherein said at least one electrical device is located inside at least one of said at least one protection ring.

13 Claims, 19 Drawing Sheets

(51) Int. Cl.
*B81B 7/00* (2006.01)
*G01C 19/5783* (2012.01)

(56) References Cited

U.S. PATENT DOCUMENTS

2013/0017643 A1* 1/2013 Lin ................... B81C 1/00301
                                                    438/51
2013/0192338 A1* 8/2013 Mayer ................ G01N 33/4972
                                                    73/23.3
2016/0300781 A1* 10/2016 Xue ..................... H01L 23/043

* cited by examiner

PROTECTION STRUCTURE FOR SEMICONDUCTOR DEVICE PACKAGE

FIELD OF THE INVENTION

The present invention relates to a chip stack having a protection structure for semiconductor device package, especially a chip stack having high structure strength and a protection structure for semiconductor device package.

BACKGROUND OF THE INVENTION

When a system in package (SIP) includes the surface acoustic wave device or the bulk acoustic wave device etc., during packaging, if the packaging material directly covers the surface acoustic wave device or the bulk acoustic wave device, it will negatively impact the performance of the surface acoustic wave device or the bulk acoustic wave device. Furthermore, when a system in package (SIP) includes the micro-electro-mechanical device or the gyroscope etc., during packaging, if the packaging material directly covers the micro-electro-mechanical device or the gyroscope, sometimes the micro-electro-mechanical device or the gyroscope cannot even work properly. Hence, in conventional technique, when a system in package includes the surface acoustic wave device, the bulk acoustic wave device, the micro-electro-mechanical device or the gyroscope etc., usually a cavity will be formed around these devices such that the packaging material may not contact with these devices in order to avoid the problem mentioned the above.

Please refer to FIG. 15~FIG. 15C which are the production process sectional view of an embodiment of the conventional technique. In FIG. 15, it comprises a substrate 80, an acoustic wave device 81, a sacrificial layer 82 and a first SU8 photoresist layer 83. The acoustic wave device 81 is formed on the substrate 80. The sacrificial layer 82 on the acoustic wave device 81 and the substrate 80 and covers the acoustic wave device 81. The first SU8 photoresist layer 83 is formed on the sacrificial layer 82 and the substrate 80. In FIG. 15A, the first SU8 photoresist layer 83 is etched many etching holes 86, and the bottom of the etching holes 86 is the sacrificial layer 82. In FIG. 15B, an etching solution contacts with the sacrificial layer 82 through these etching holes 86 and etches and removes the sacrificial layer 82 to form a cavity 85. In FIG. 15C, forming a second SU8 photoresist layer 84 on the first SU8 photoresist layer 83, wherein the etching holes 86 are filled by the second SU8 photoresist layer 84 such that the cavity 85 becomes a hermetic cavity 85. However as the area of the acoustic wave device 81 is getting wider, the area of the cavity 85 is getting wider too. This will cause the insufficient structure strength of the SU8 photoresist and such that the first SU8 photoresist layer 83 and the second SU8 photoresist layer 84 may concave down. Even further, if the bottom of the first SU8 photoresist layer 83 contacts with the acoustic wave device 81, it will negatively impact the performance of the acoustic wave device 81.

Accordingly, the present invention has developed a new design which may avoid the above mentioned drawbacks, may significantly enhance the performance of the devices and may take into account economic considerations. Therefore, the present invention then has been invented.

SUMMARY OF THE INVENTION

The main technical problem that the present invention is seeking to solve is: how to form a cavity with high structure strength around the surface acoustic wave device, the bulk acoustic wave device or the micro-electro-mechanical device etc., in order to avoid the contact of these devices and the surrounding of the cavity to negatively impact on the performance of these devices.

In order to solve the problems mentioned the above and to achieve the expected effect, the present invention provides a chip stack having a protection structure for semiconductor device package, which comprises a first chip and a second chip stacked with each other, wherein said first chip has a first surface, said second chip has a second surface, said first surface and said second surface are two surfaces facing to each other, wherein at least one metal pillar is formed on at least one of said first surface and said second surface and connected with the other, at least one protection ring is formed on at least one of said first surface and said second surface and having a first gap with the other, and at least one electrical device is formed on at least one of said first surface and said second surface, wherein said at least one electrical device is located inside at least one of said at least one protection ring.

In an embodiment of the chip stack having a protection structure for semiconductor device package, wherein a width of said first gap is greater than 1 μm and less than 30 μm.

In an embodiment of the chip stack having a protection structure for semiconductor device package, wherein a height of said at least one protection ring is greater than 1 μm and less than 100 μm.

In an embodiment of the chip stack having a protection structure for semiconductor device package, wherein said at least one protection ring is made of at least one material selected from the group consisting of Cu, Au, Sn, In, Au alloy, Cu alloy, Sn alloy and In alloy.

In an embodiment of the chip stack having a protection structure for semiconductor device package, wherein said at least one protection ring is made of at least one material selected from the group consisting of photosensitive material, photoresist, SU8 photoresist and acrylic material.

In an embodiment of the chip stack having a protection structure for semiconductor device package, wherein a thickness of said at least one protection ring is greater than 1 μm and less than 100 μm.

In an embodiment of the chip stack having a protection structure for semiconductor device package, wherein said at least one electrical device including at least one of a surface acoustic wave device, a bulk acoustic wave device, a micro-electro-mechanical device and a gyroscope.

In an embodiment of the chip stack having a protection structure for semiconductor device package, wherein the material of the substrate of said first chip is one material selected from the group consisting of $LiTaO_3$, $LiNbO_3$, quartz, Si, GaAs, GaP, sapphire, $Al_2O_3$, InP, SiC, diamond, GaN and AlN.

In an embodiment of the chip stack having a protection structure for semiconductor device package, wherein the material of the substrate of said second chip is one material selected from the group consisting of $LiTaO_3$, $LiNbO_3$, quartz, Si, GaAs, GaP, sapphire, $Al_2O_3$, InP, SiC, diamond, GaN and AlN.

In an embodiment of the chip stack having a protection structure for semiconductor device package, wherein said at least one metal pillar is made of at least one material selected from the group consisting of Cu, Au, Au alloy and Cu alloy.

In an embodiment of the chip stack having a protection structure for semiconductor device package, further comprising a soldering metal layer coated on said at least one metal pillar, said at least one metal pillar is connected to said first surface or said second surface by said soldering metal layer.

In an embodiment of the chip stack having a protection structure for semiconductor device package, wherein said soldering metal layer is made of at least one material selected from the group consisting of In, Sn, In alloy and Sn alloy.

In an embodiment of the chip stack having a protection structure for semiconductor device package, wherein said at least one protection ring is formed on both said first surface and said second surface.

In an embodiment of the chip stack having a protection structure for semiconductor device package, wherein a second gap is formed between every two vertically aligned protection rings which are respectively formed on said first surface and said second surface.

In an embodiment of the chip stack having a protection structure for semiconductor device package, wherein a width of said second gap is greater than 1 μm and less than 30 μm.

In an embodiment of the chip stack having a protection structure for semiconductor device package, wherein said first chip is stacked on said second chip or said second chip is stacked on said first chip.

For further understanding the characteristics and effects of the present invention, some preferred embodiments referred to drawings are in detail described as follows.

DETAILED DESCRIPTIONS OF PREFERRED EMBODIMENTS

Figure 1:
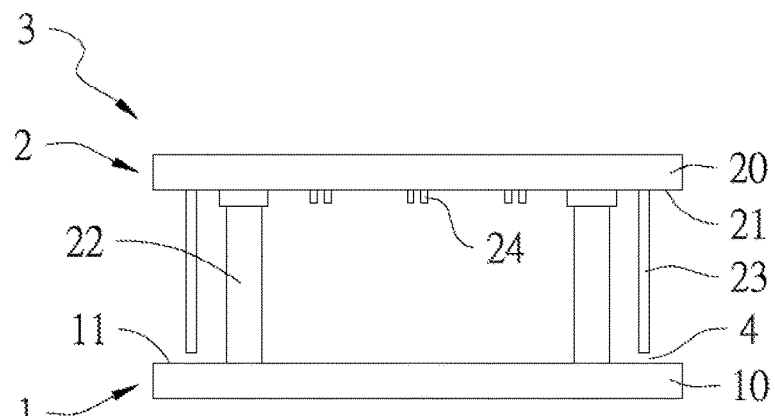
FIG. 1~FIG. 1B are respectively the sectional view and the exploded sectional view and top view before chips stacked of an embodiment of a chip stack having a protection structure for semiconductor device package of the present invention.
Figure 1A:
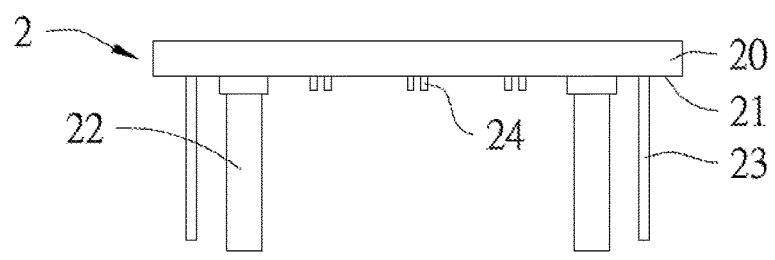
Figure 1B:
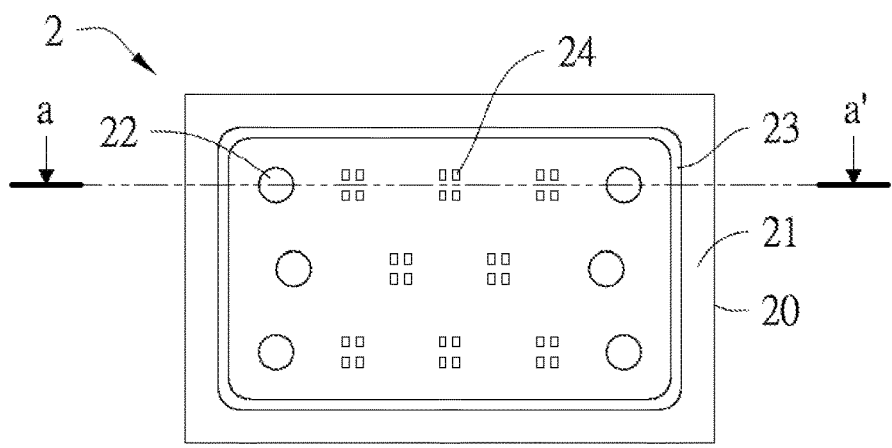

Please refer to FIG. 1~FIG. 1B, which are respectively the sectional view and the exploded sectional view and top view before chips stacked of an embodiment of a chip stack having a protection structure for semiconductor device package of the present invention. A chip stack 3 comprises a first chip 1 and a second chip 2, wherein the first chip 1 includes a first substrate 10 and a first surface 11; the second chip 2 includes a second substrate 20, a second surface 21, at least one metal pillar 22, a protection ring 23 and at least one electrical device 24. The first surface 11 of the first chip 1 and the second surface 21 of the second chip 2 are facing to each other. The material of the substrate 10 of the first chip 1 is one material selected from the group consisting of $LiTaO_3$, $LiNbO_3$, quartz, Si, GaAs, GaP, sapphire, $Al_2O_3$, InP, SiC, diamond, GaN and AlN. The material of the substrate 20 of the second chip 2 is one material selected from the group consisting of $LiTaO_3$, $LiNbO_3$, quartz, Si, GaAs, GaP, sapphire, $Al_2O_3$, InP, SiC, diamond, GaN and AlN. The metal pillars 22 are formed on the second surface 21 of the second chip 2. The metal pillar 22 is made of at least one material selected from the group consisting of Cu, Au, Au alloy and Cu alloy. The metal pillar 22 may be used for the signal transferring between the first chip 1 and the second chip 2 and may also be used as the support structure for the chip stack 3. The protection ring 23 is formed on the second surface 21 of the second chip 2. The protection ring 23 is made of at least one material selected from the group consisting of Cu, Au, Sn, In, Au alloy, Cu alloy, Sn alloy and In alloy. The protection ring 23 may also be made of at least one material selected from the group consisting of photosensitive material, photoresist, SU8 photoresist and acrylic material. The electrical devices 24 are formed on the second surface 21 of the second chip 2, wherein the electrical devices 24 are located inside the protection ring 23 of the second chip 2, and the metal pillars 22 are also located inside the protection ring 23 of the second chip 2. The electrical devices 24 may include at least one of a surface acoustic wave device, a bulk acoustic wave device, a micro-electro-mechanical device and a gyroscope. The second chip 2 is stacked on the first chip 1 to form the chip stack 3 such that a first gap 4 exists between the protection ring 23 of the second chip 2 and the first chip 1. The width of the first gap 4 between the protection ring 23 of the second chip 2 and the first chip 1 is greater than 1 µm and less than 30 µm.

Figure 2:
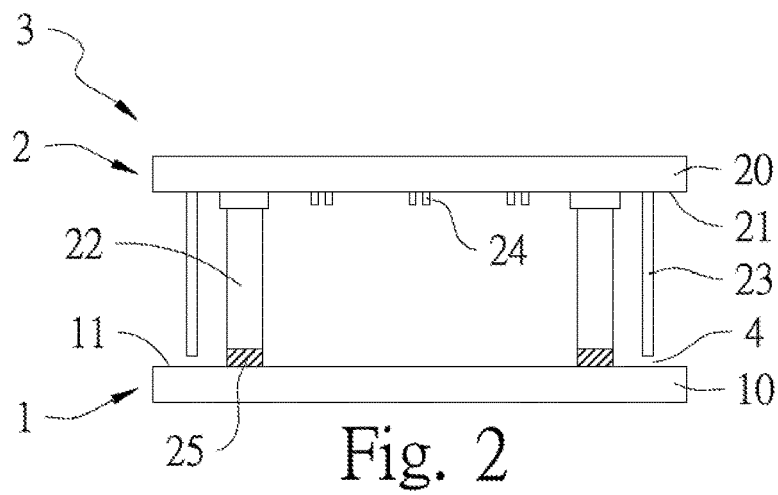
FIG. 2 and FIG. 2A are respectively the sectional view and the exploded sectional view before chips stacked of an embodiment of a chip stack having a protection structure for semiconductor device package of the present invention.
Figure 2A:
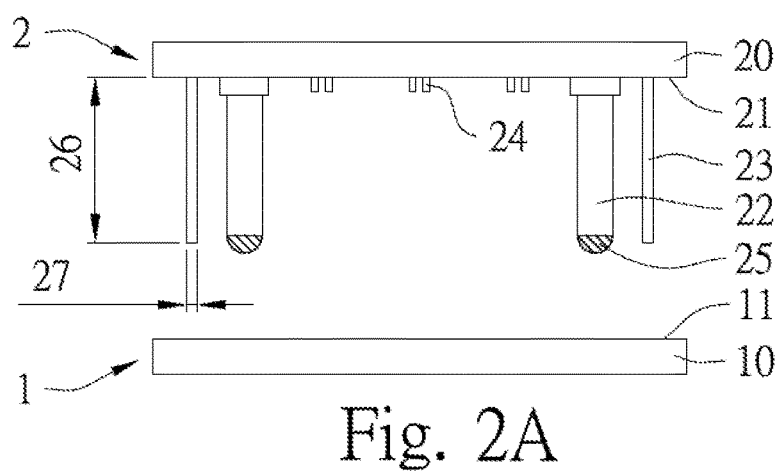

Please refer to FIG. 2 and FIG. 2A, which are respectively the sectional view and the exploded sectional view before chips stacked of an embodiment of a chip stack having a protection structure for semiconductor device package of the present invention. The main structure is mostly similar to the structure of the embodiment shown in FIG. 1~FIG. 1B, except that it further comprises a soldering metal layer 25 coated on the metal pillar 22. The metal pillars 22 are connected to the first surface 11 of the first chip 1 by the soldering metal layer 25. The soldering metal layer 25 is made of at least one material selected from the group consisting of In, Sn, In alloy and Sn alloy. A height 26 of the protection ring 23 is greater than 1 µm and less than 100 µm. A thickness 27 of the protection ring 23 is greater than 1 µm and less than 100 µm.

Figure 2B:
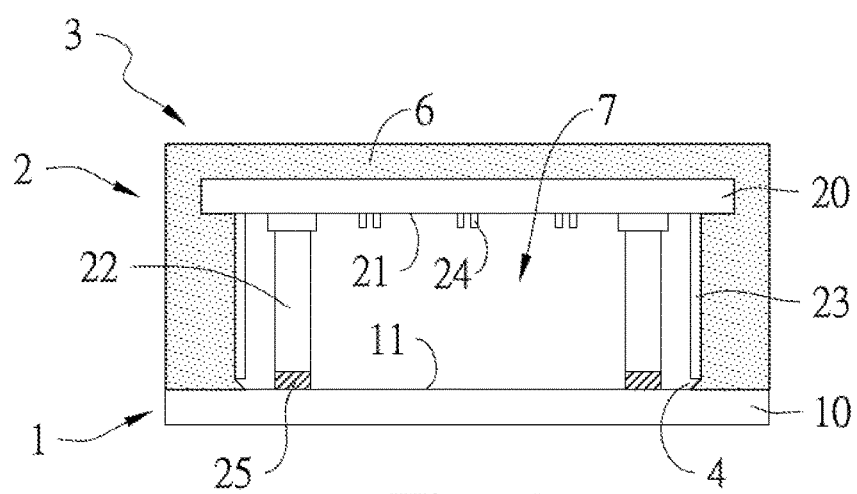
FIG. 2B is the sectional schematic view after packaged of the embodiment of FIG. 2 and FIG. 2A.

Please refer to FIG. 2B, which is the sectional schematic view after packaged of the embodiment of FIG. 2 and FIG. 2A. Before stacking the second chip 2 on the first chip 1, firstly the second surface 21 of the second chip 2 will go sticking the flux. And then the second chip 2 is stacked on the first chip 1 such that the metal pillars 22 are connected to the first surface 11 of the first chip 1 by the soldering metal layer 25. At this time, there still remains much flux on the second surface 21 of the second chip 2 needed to be removed. Hence the function of the first gap 4 between the protection ring 23 of the second chip 2 and the first chip 1 is to provide the gap for a solvent such that the solvent may remove the remaining flux through the first gap 4 into the area surrounded by the protection ring 23 of the second chip 2. Furthermore, another function the first gap 4 may provide is that if choosing a packaging material 6 with a proper viscosity for package, after the chip stack 3 is packaged by the packaging material 6, the packaging material 6 may not permeate through the first gap 4 into the area surrounded by the protection ring 23. Hence a cavity 7 is formed within the area surrounded by the protection ring 23. Such a cavity 7 is needed for the electrical devices 24, such as the surface acoustic wave device, the bulk acoustic wave device, the micro-electro-mechanical device and the gyroscope etc., such that the electrical devices 24 may not contact with the packaging material 6 in order to ensure that the performance of the electrical devices 24 may not be negatively impacted.

In other embodiment, the first chip 1 may be stacked on the second chip 2; while the electrical device(s), the protection ring(s), and the metal pillar(s) may be formed, but not limited to, on the first chip 1 or the second chip 2. The electrical device(s), the protection ring(s), and the metal pillar(s) may be formed only on the first surface 11 of the first chip 1, the electrical device(s), the protection ring(s), and the metal pillar(s) may be formed only on the second surface 21 of the second chip 2, or the metal pillar(s) may be formed on both the first surface 11 of the first chip 1 and the second surface 21 of the second chip 2.

Figure 3:
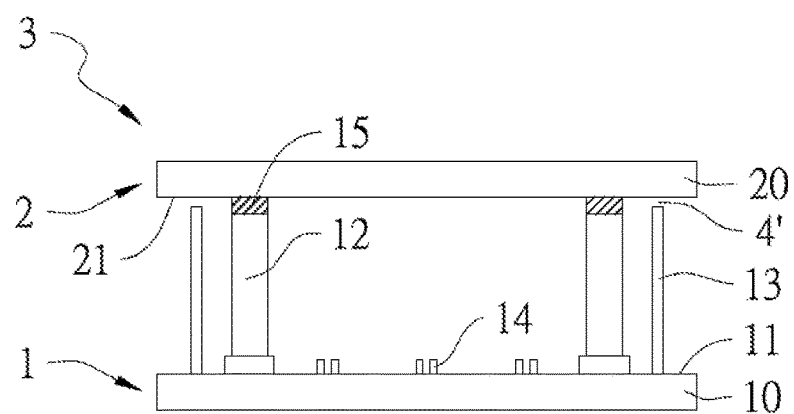
FIG. 3~FIG. 3B are respectively the sectional view and the exploded sectional view and top view before chips stacked of an embodiment of a chip stack having a protection structure for semiconductor device package of the present invention.
Figure 3A:
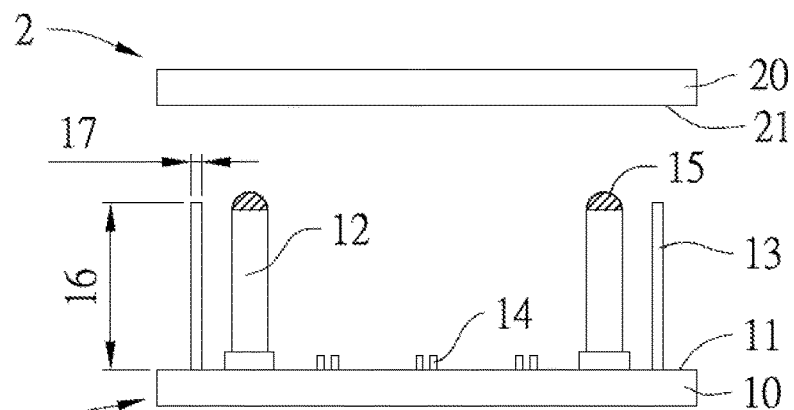
Figure 3B:
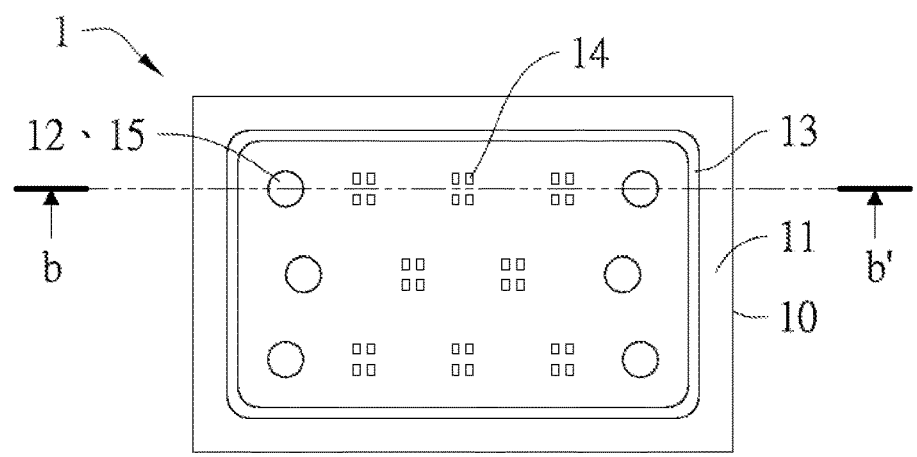

Please refer to FIG. 3~FIG. 3B, which are respectively the sectional view and the exploded sectional view and top view before chips stacked of an embodiment of a chip stack having a protection structure for semiconductor device package of the present invention. The main structure is mostly similar to the structure of the embodiment shown in FIG. 2 and FIG. 2A, except that the first chip 1 is stacked on the second chip 2 to form the chip stack 3 such that a first gap 4' exists between the protection ring 13 of the first chip 1 and the second chip 2. The first chip 1 further includes at least one metal pillar 12, a protection ring 13 and at least one electrical device 14. The metal pillars 12 are formed on the first surface 11 of the first chip 1. The metal pillar 12 is made of at least one material selected from the group consisting of Cu, Au, Au alloy and Cu alloy. The metal pillar 12 may be used for the signal transferring between the first chip 1 and the second chip 2 and may also be used as the support structure for the chip stack 3. A soldering metal layer 15 is coated on the metal pillar 12. The metal pillars 12 are connected to the second surface 21 of the second chip 2 by the soldering metal layer 15. The soldering metal layer 15 is made of at least one material selected from the group consisting of In, Sn, In alloy and Sn alloy. The protection ring 13 is formed on the first surface 11 of the first chip 1. A height 16 of the protection ring 13 is greater than 1 µm and less than 100 µm. A thickness 17 of the protection ring 13 is greater than 1 µm and less than 100 µm. The protection ring 13 is made of at least one material selected from the group consisting of Cu, Au, Sn, In, Au alloy, Cu alloy, Sn alloy and In alloy. The protection ring 13 may also be made of at least one material selected from the group consisting of photosensitive material, photoresist, SU8 photoresist and acrylic material. The electrical devices 14 are formed on the first surface 11 of the first chip 1, wherein the electrical devices 14 are located inside the protection ring 13 of the first chip 1, and the metal pillars 12 are also located inside the protection ring 13 of the first chip 1. The electrical devices 14 may include at least one of a surface acoustic wave device, a bulk acoustic wave device, a micro-electro-mechanical device and a gyroscope. A first gap 4' exists between the protection ring 13 of the first chip 1 and the second chip 2. The width of the first gap 4' between the protection ring 13 of the first chip 1 and the second chip 2 is greater than 1 µm and less than 30 µm. The first gap 4' has the same function as the first gap 4 mentioned the above.

Figure 4:
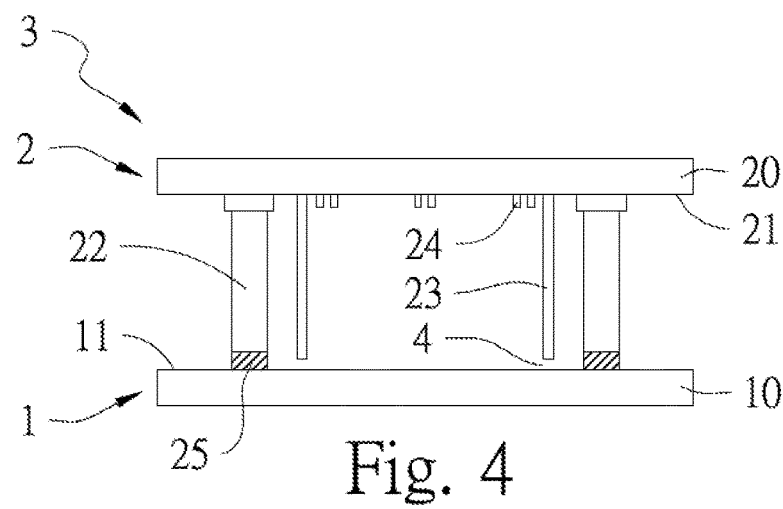
FIG. 4~FIG. 4B are respectively the sectional view and the exploded sectional view and top view before chips stacked of an embodiment of a chip stack having a protection structure for semiconductor device package of the present invention.
Figure 4A:
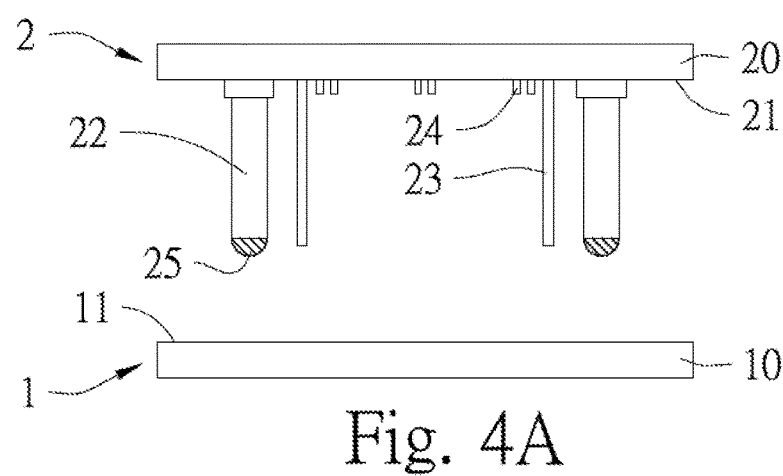
FIG. 4C is the top view before chips stacked of another embodiment of a chip stack having a protection structure for semiconductor device package of the present invention.
Figure 4B:
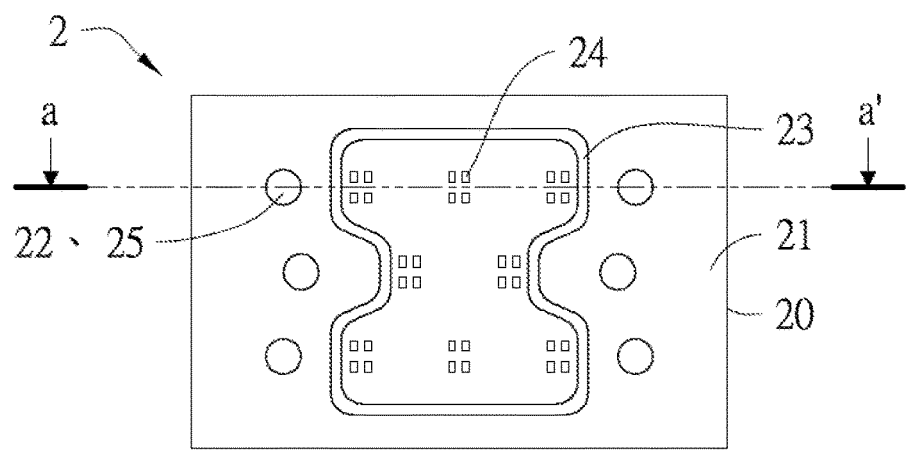

Please refer to FIG. 4~FIG. 4B, which are respectively the sectional view and the exploded sectional view and top view before chips stacked of an embodiment of a chip stack having a protection structure for semiconductor device package of the present invention. The main structure is mostly similar to the structure of the embodiment shown in FIG. 2 and FIG. 2A, except that the metal pillars 22 are located outside the protection ring 23 of the second chip 2.

Figure 4C:
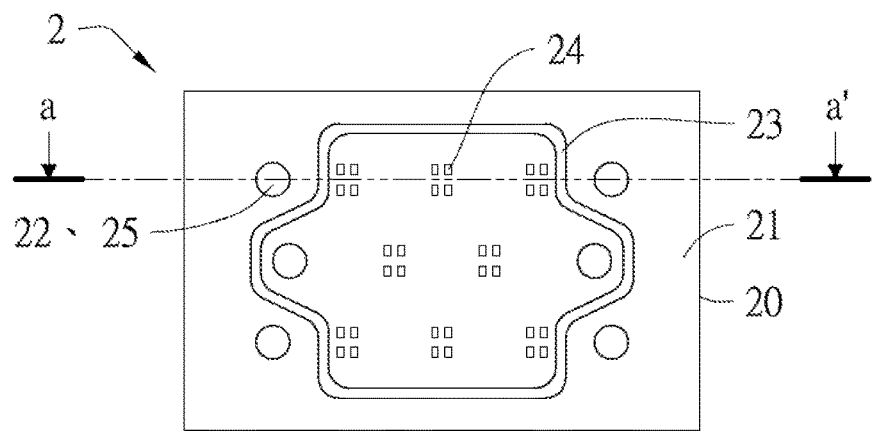

Please refer to FIG. 4C, which is the top view before chips stacked of another embodiment of a chip stack having a protection structure for semiconductor device package of the present invention. The main structure is mostly similar to the structure of the embodiment shown in FIG. 4~FIG. 4B, except that part of the metal pillars 22 are located inside the protection ring 23 of the second chip 2 while the rest part of the metal pillars 22 are located outside the protection ring 23 of the second chip 2.

Figure 5:
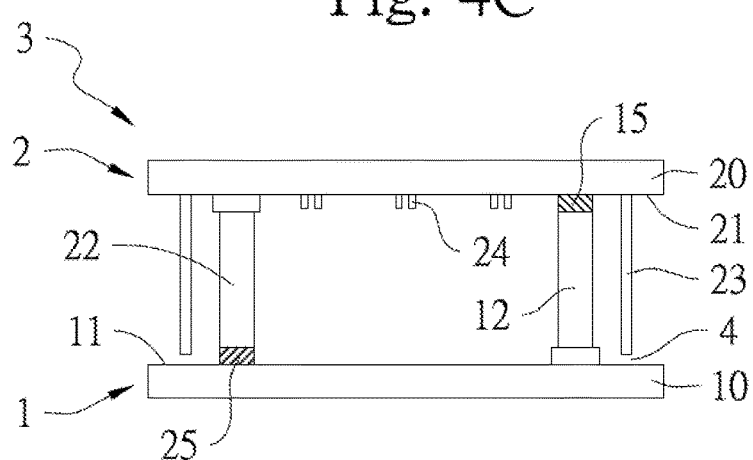
FIG. 5~FIG. 5C are respectively the sectional view and the exploded sectional view and top view before chips stacked of an embodiment of a chip stack having a protection structure for semiconductor device package of the present invention.
Figure 5A:
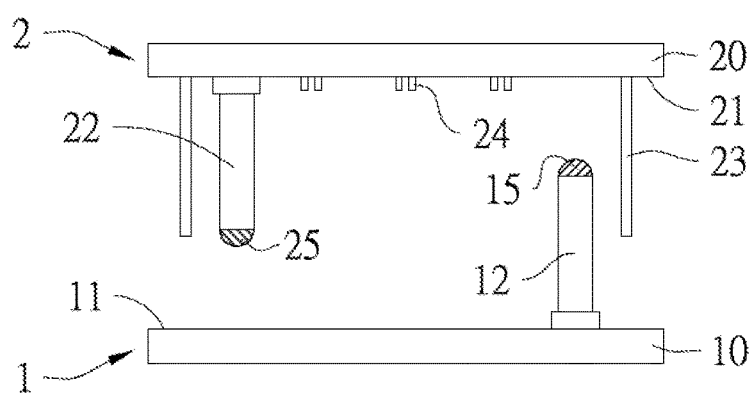
Figure 5B:
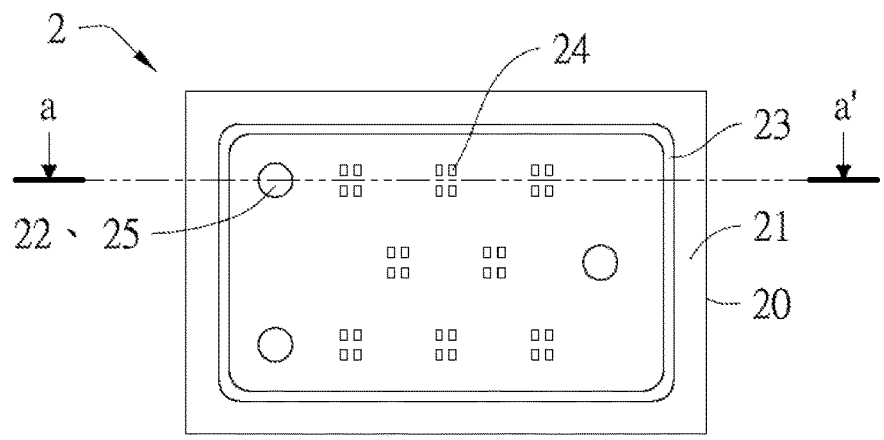
Figure 5C:
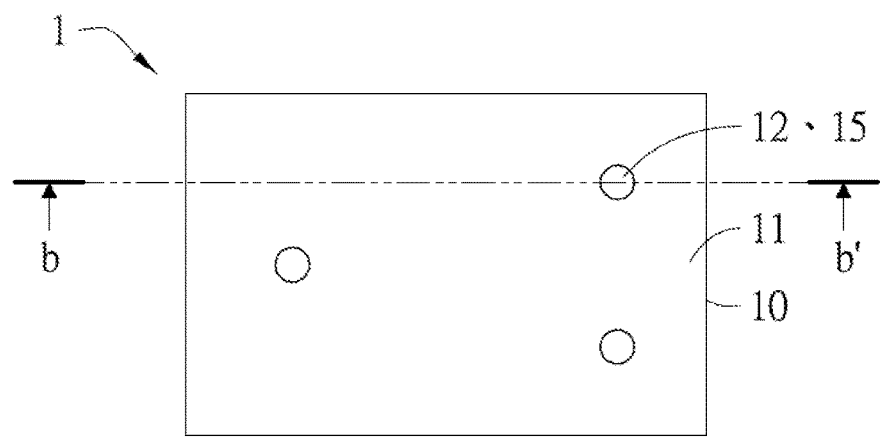

Please refer to FIG. 5~FIG. 5C, which are respectively the sectional view and the exploded sectional view and top view before chips stacked of an embodiment of a chip stack having a protection structure for semiconductor device package of the present invention. The main structure is mostly similar to the structure of the embodiment shown in FIG. 2 and FIG. 2A, except that the metal pillars 12 and the metal pillars 22 are formed respectively on the first surface 11 of the first chip 1 and the second surface 21 of the second chip 2. In this embodiment, the metal pillar 12 and the metal pillar 22 are not vertically aligned with each other, which mean that the projection of the metal pillar 12 does not overlap with the projection of the metal pillar 22.

Figure 6:
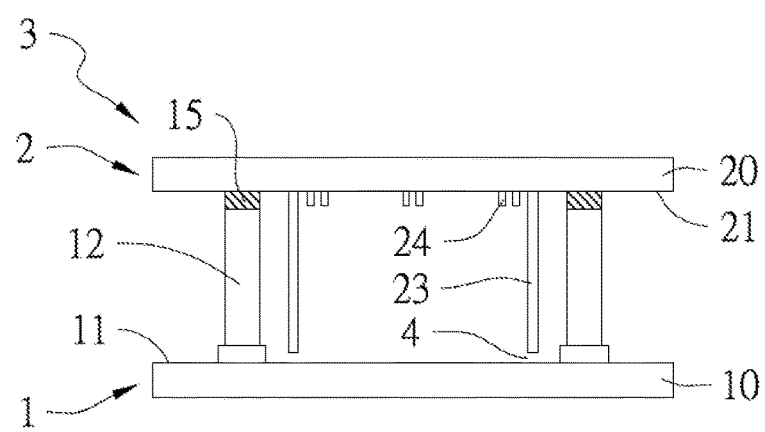
FIG. 6~FIG. 6C are respectively the sectional view and the exploded sectional view and top view before chips stacked of an embodiment of a chip stack having a protection structure for semiconductor device package of the present invention.
Figure 6A:
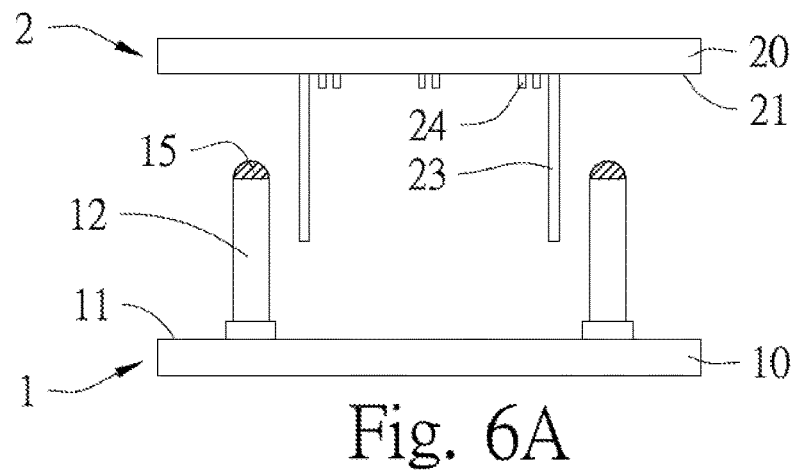
Figure 6B:
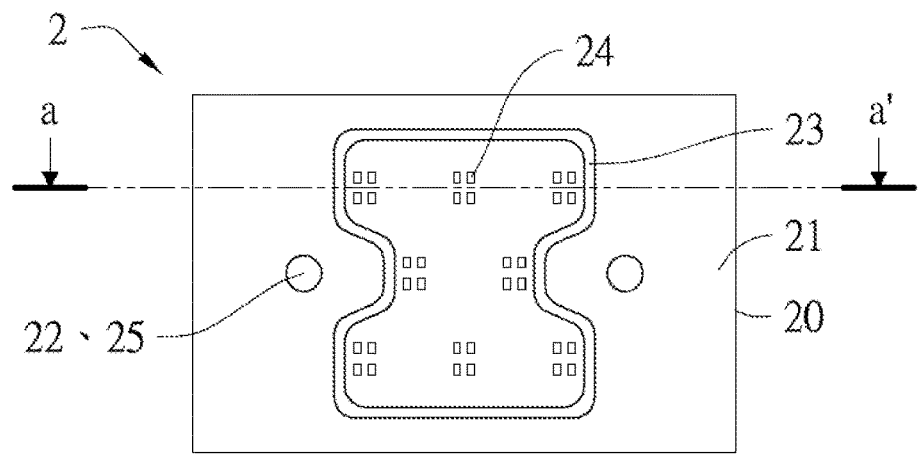
Figure 6C:
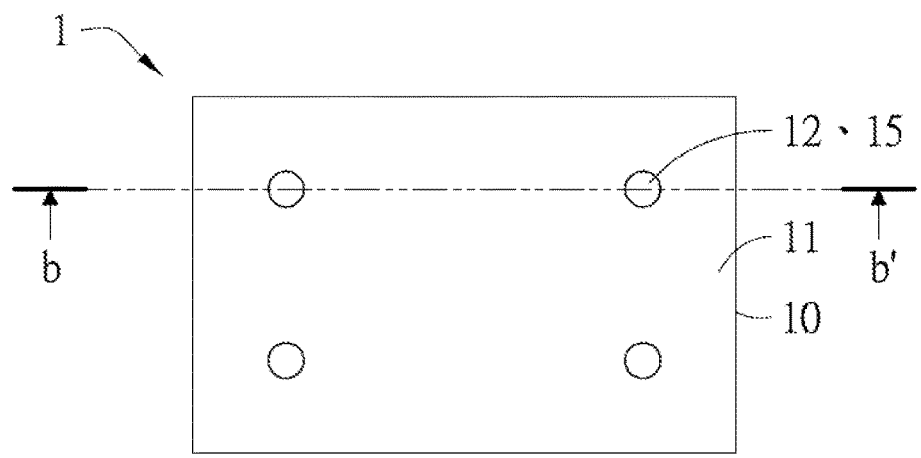

Please refer to FIG. 6~FIG. 6C, which are respectively the sectional view and the exploded sectional view and top view before chips stacked of an embodiment of a chip stack having a protection structure for semiconductor device package of the present invention. The main structure is mostly similar to the structure of the embodiment shown in FIG. 4~FIG. 4B, except that the metal pillars 12 and the metal pillars 22 are formed respectively on the first surface 11 of the first chip 1 and the second surface 21 of the second chip 2. In this embodiment, the metal pillar 12 and the metal pillar 22 are not vertically aligned with each other, which mean that the projection of the metal pillar 12 does not overlap with the projection of the metal pillar 22.

Figure 7:
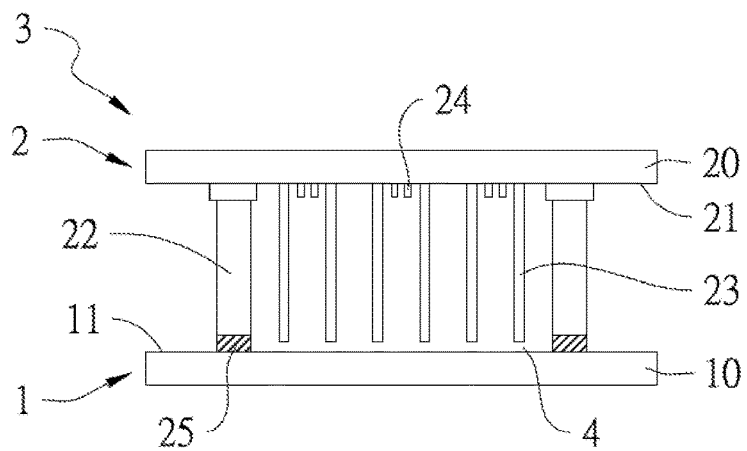
FIG. 7~FIG. 7B are respectively the sectional view and the exploded sectional view and top view before chips stacked of an embodiment of a chip stack having a protection structure for semiconductor device package of the present invention.
Figure 7A:
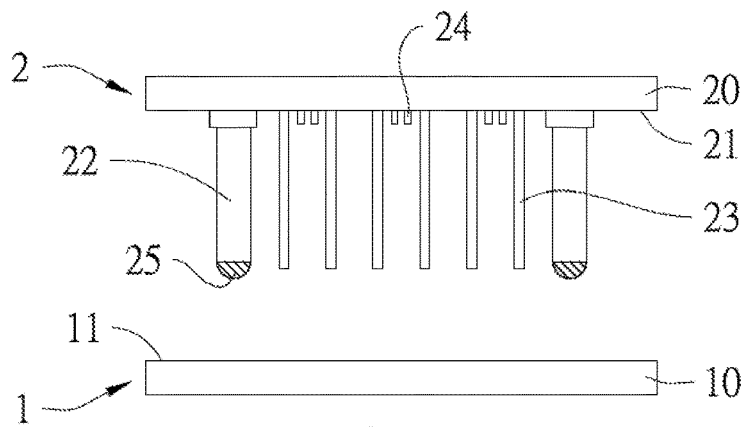
Figure 7B:
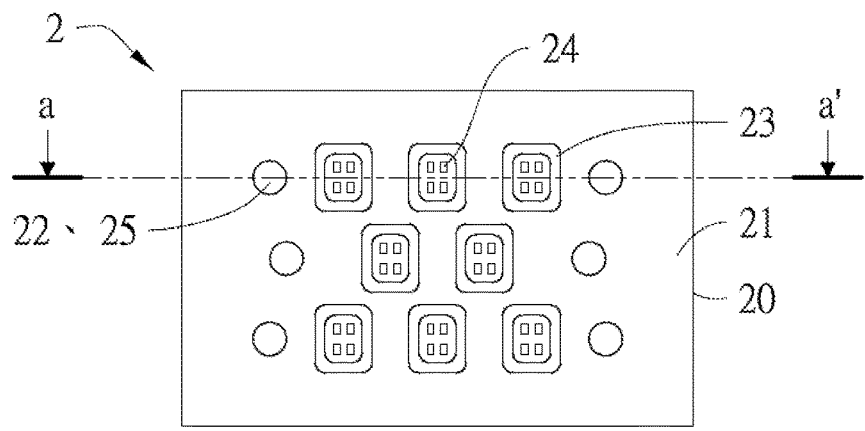

Please refer to FIG. 7~FIG. 7B, which are respectively the sectional view and the exploded sectional view and top view before chips stacked of an embodiment of a chip stack having a protection structure for semiconductor device package of the present invention. The main structure is mostly similar to the structure of the embodiment shown in FIG. 2 and FIG. 2A, except that the electrical devices 24 of the eight small areas are located respectively inside the eight protection rings 23 of the second chip 2.

Figure 8:
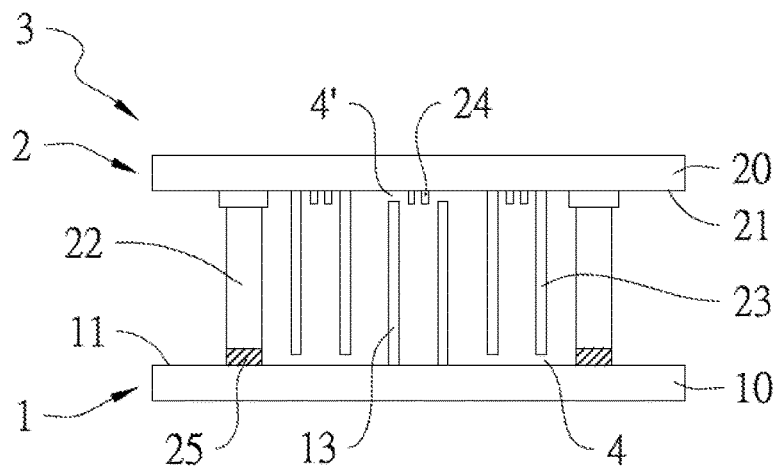
FIG. 8~FIG. 8C are respectively the sectional view and the exploded sectional view and top view before chips stacked of an embodiment of a chip stack having a protection structure for semiconductor device package of the present invention.
Figure 8A:
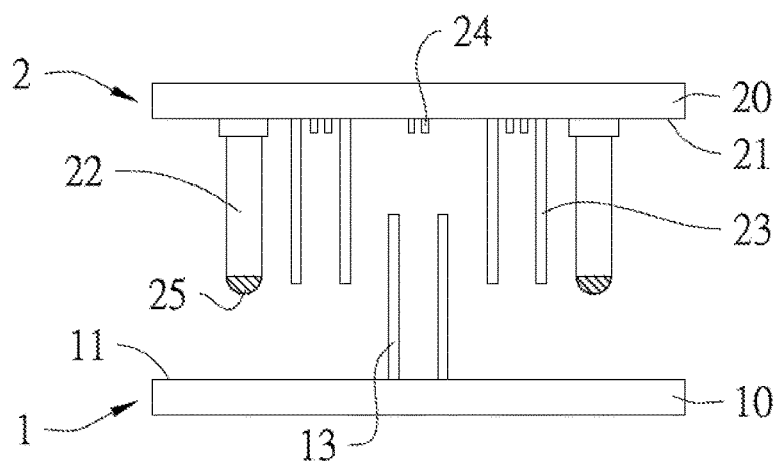
Figure 8B:
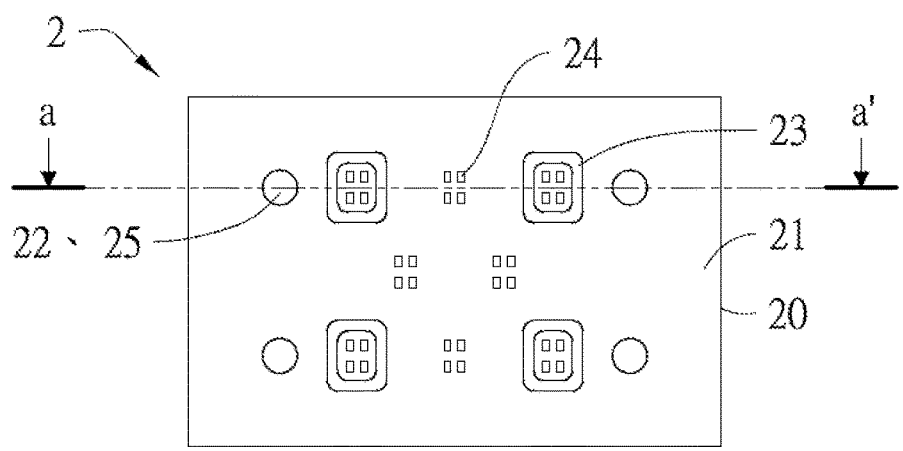
Figure 8C:
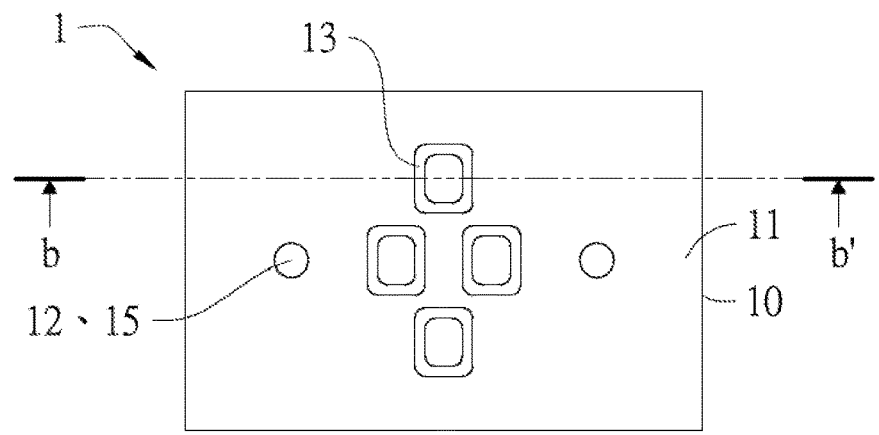

Please refer to FIG. 8~FIG. 8C, which are respectively the sectional view and the exploded sectional view and top view before chips stacked of an embodiment of a chip stack having a protection structure for semiconductor device package of the present invention. The main structure is mostly similar to the structure of the embodiment shown in FIG. 7~FIG. 7B, except that the metal pillars 12 and the metal pillars 22 are formed respectively on the first surface 11 of the first chip 1 and the second surface 21 of the second chip 2, and the protection rings 13 and the protection rings 23 are formed respectively on the first surface 11 of the first chip 1 and the second surface 21 of the second chip 2. In this embodiment, the metal pillar 12 and the metal pillar 22 are not vertically aligned with each other, which mean that the projection of the metal pillar 12 does not overlap with the projection of the metal pillar 22. And the protection ring 13 and the protection ring 23 are not vertically aligned with each other, which mean that the projection of the protection ring 13 does not overlap with the projection of the protection ring 23. The electrical devices 24 of the eight small areas are located respectively inside the four protection rings 13 of the first chip 1 and the four protection rings 23 of the second chip 2.

Figure 9:
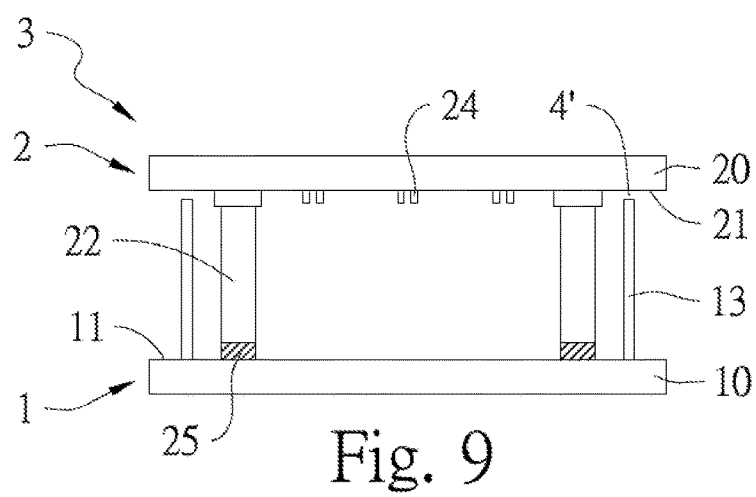
FIG. 9~FIG. 9C are respectively the sectional view and the exploded sectional view and top view before chips stacked of an embodiment of a chip stack having a protection structure for semiconductor device package of the present invention.
Figure 9A:
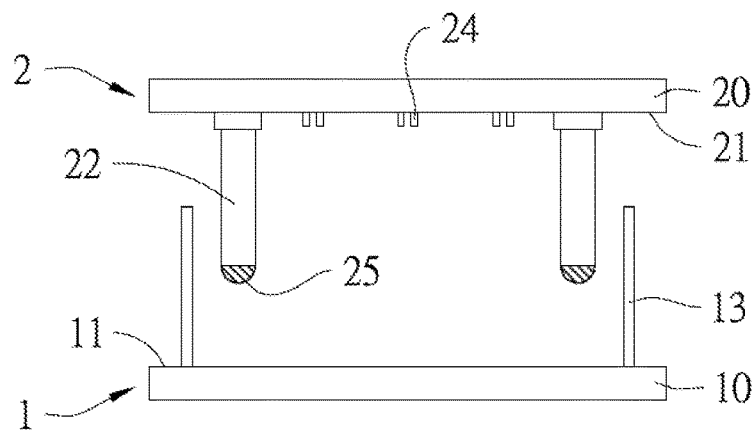
Figure 9B:
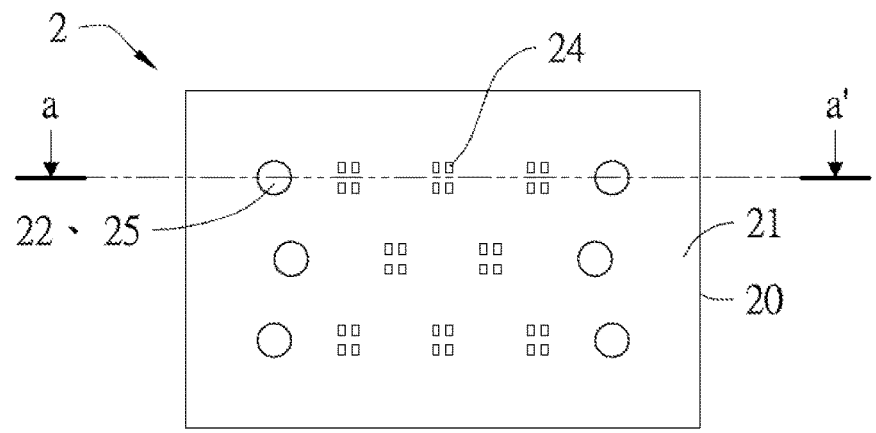
Figure 9C:
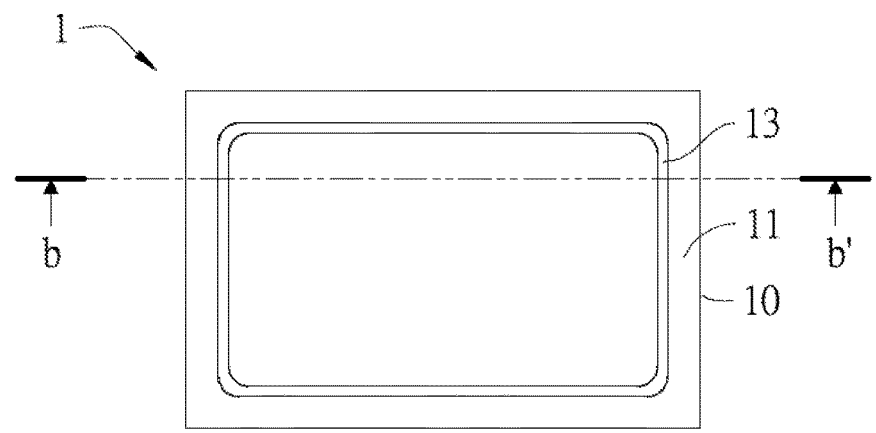

Please refer to FIG. 9~FIG. 9C, which are respectively the sectional view and the exploded sectional view and top view before chips stacked of an embodiment of a chip stack having a protection structure for semiconductor device package of the present invention. The main structure is mostly similar to the structure of the embodiment shown in FIG. 2 and FIG. 2A, except that the protection ring 13 is formed on the first surface 11 of the first chip 1.

Figure 10:
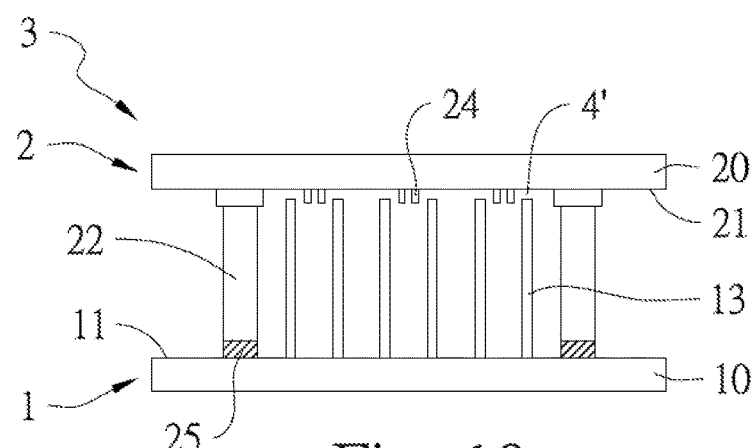
FIG. 10~FIG. 10C are respectively the sectional view and the exploded sectional view and top view before chips stacked of an embodiment of a chip stack having a protection structure for semiconductor device package of the present invention.
Figure 10A:
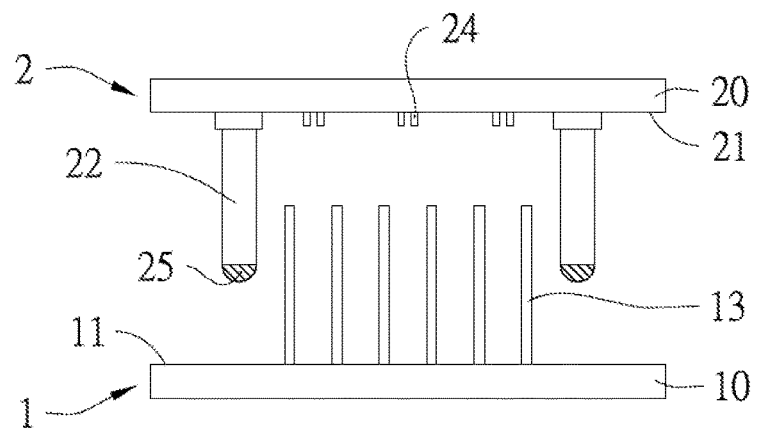
Figure 10B:
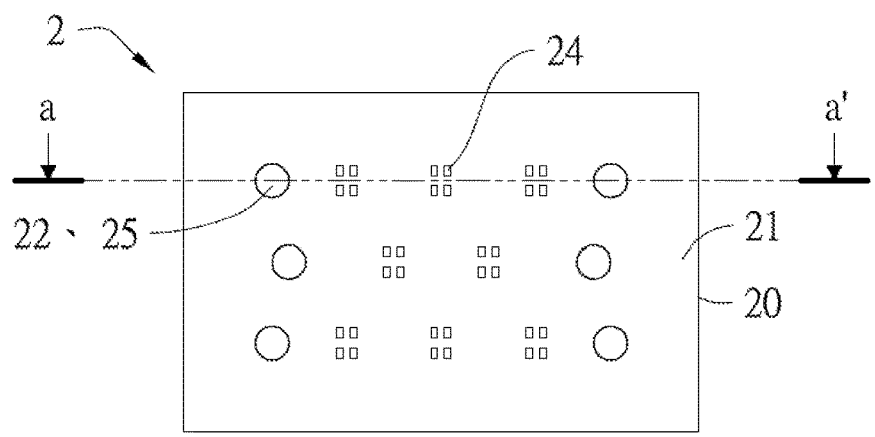
Figure 10C:
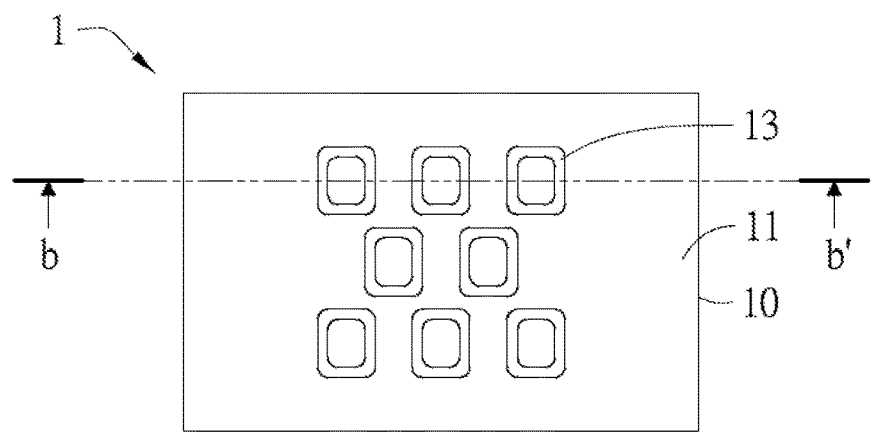

Please refer to FIG. 10~FIG. 10C, which are respectively the sectional view and the exploded sectional view and top view before chips stacked of an embodiment of a chip stack having a protection structure for semiconductor device package of the present invention. The main structure is mostly similar to the structure of the embodiment shown in FIG. 7~FIG. 7B, except that the protection rings 13 are formed on the first surface 11 of the first chip 1. The electrical devices 24 of the eight small areas are located respectively inside the eight protection rings 13 of the first chip 1

Figure 11:
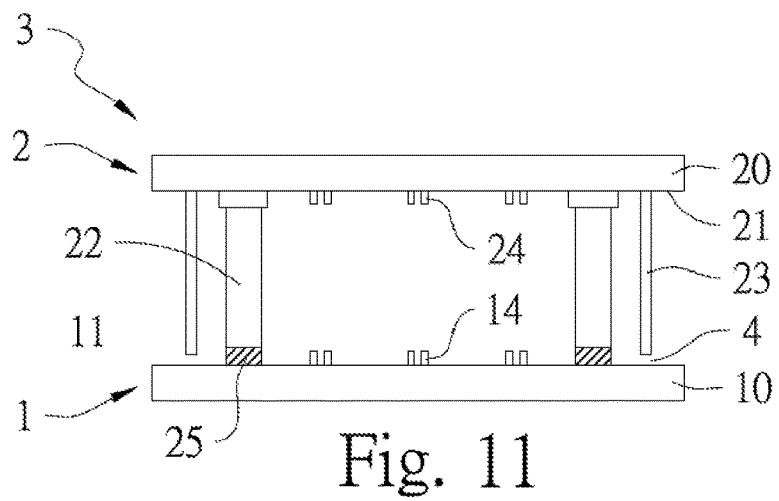
FIG. 11~FIG. 11C are respectively the sectional view and the exploded sectional view and top view before chips stacked of an embodiment of a chip stack having a protection structure for semiconductor device package of the present invention.
Figure 11A:
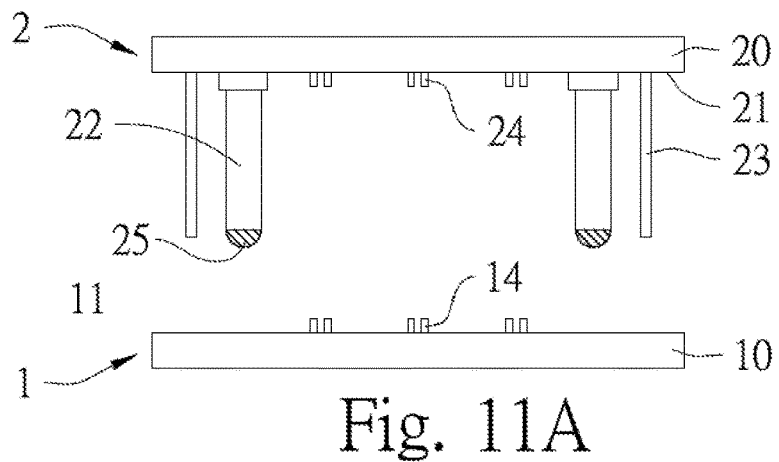
Figure 11B:
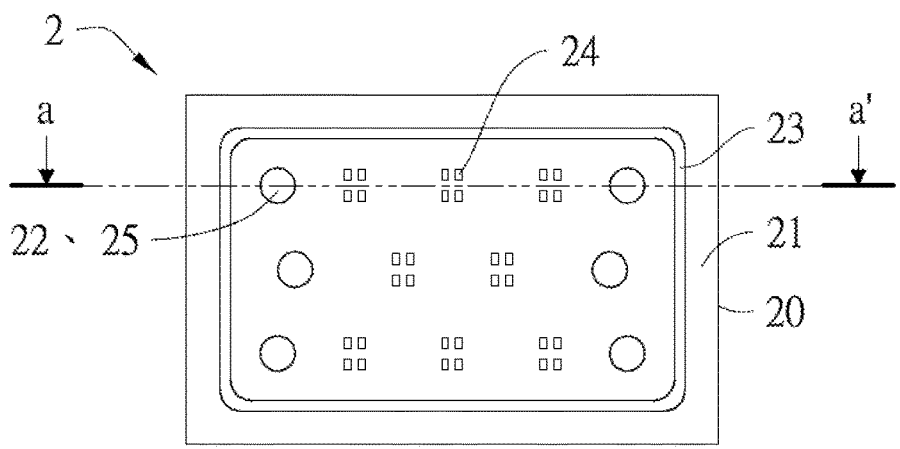
Figure 11C:
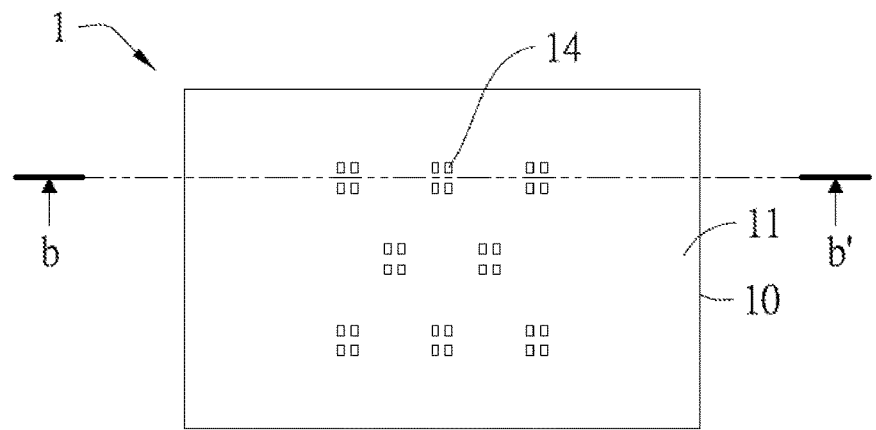

Please refer to FIG. 11~FIG. 11C, which are respectively the sectional view and the exploded sectional view and top view before chips stacked of an embodiment of a chip stack having a protection structure for semiconductor device package of the present invention. The main structure is mostly similar to the structure of the embodiment shown in FIG. 2 and FIG. 2A, except that the electrical devices 14 and the electrical devices 24 are formed respectively on the first surface 11 of the first chip 1 and the second surface 21 of the second chip 2. In the case that all the electrical devices 14 and the electrical devices 24 are formed on the same chip, it needs much more area of the chip; while the electrical devices 14 and the electrical devices 24 are formed respectively on the first surface 11 of the first chip 1 and the second surface 21 of the second chip 2, the needed area will be reduced by half. It is very benefit to reducing the size of the chips.

Figure 12:
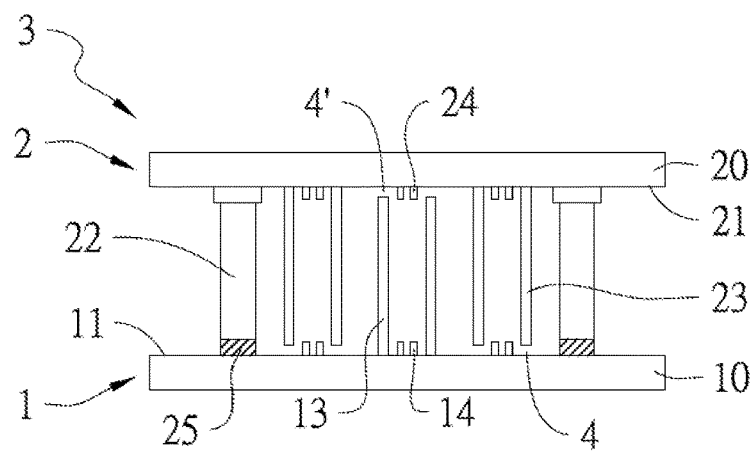
FIG. 12~FIG. 12C are respectively the sectional view and the exploded sectional view and top view before chips stacked of an embodiment of a chip stack having a protection structure for semiconductor device package of the present invention.
Figure 12A:
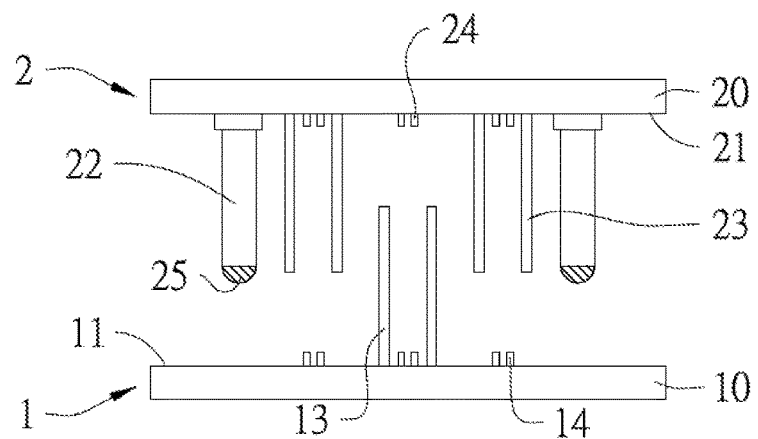
FIG. 12D is the sectional schematic view after packaged of the embodiment of FIG. 12.
Figure 12B:
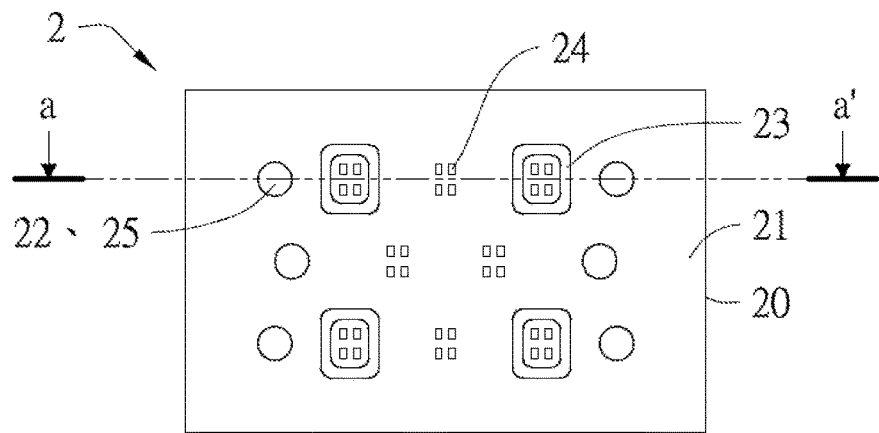
Figure 12C:
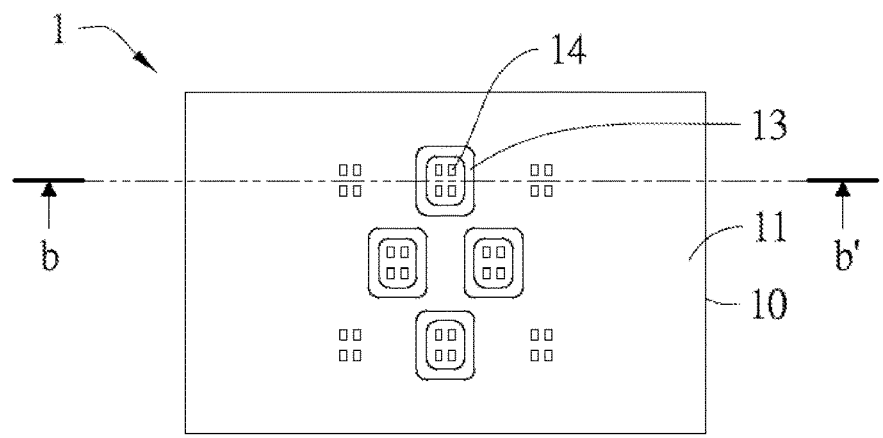

Please refer to FIG. 12~FIG. 12C, which are respectively the sectional view and the exploded sectional view and top view before chips stacked of an embodiment of a chip stack having a protection structure for semiconductor device package of the present invention. The main structure is mostly similar to the structure of the embodiment shown in FIG. 11~FIG. 11C, except that the protection rings 13 and the protection rings 23 are formed respectively on the first surface 11 of the first chip 1 and the second surface 21 of the second chip 2. In this embodiment, the protection ring 13 and the protection ring 23 are not vertically aligned with each other, which mean that the projection of the protection ring 13 does not overlap with the projection of the protection ring 23. The electrical devices 14 of the eight small areas and the electrical devices 24 of the eight other small areas are located respectively inside the four protection rings 13 of the first chip 1 and the four protection rings 23 of the second chip 2.

Figure 12D:
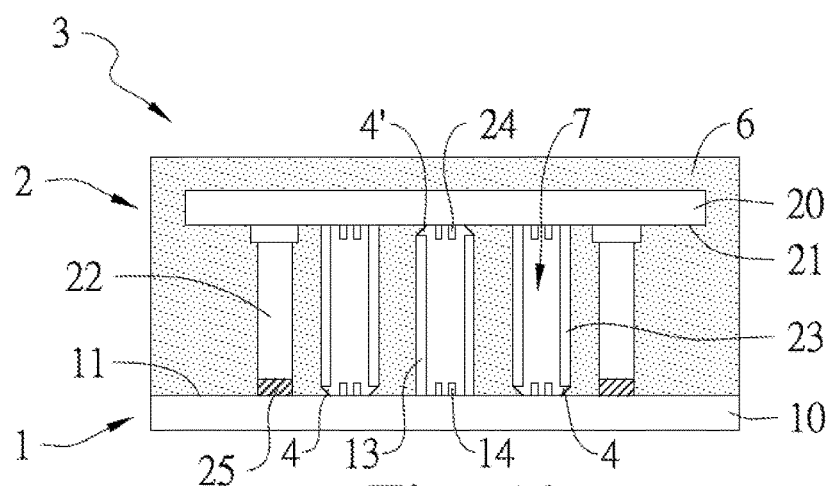

Please refer to FIG. 12D, which is the sectional schematic view after packaged of the embodiment of FIG. 12. Eight cavities 7 are formed within the area of four protection rings 13 of the first chip 1 and four protection rings 23 of the second chip 2 after the chip stack 3 is packaged by the packaging material.

Figure 13:
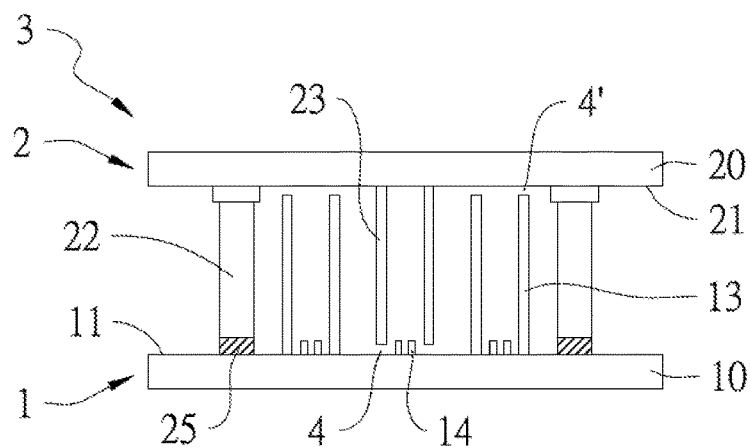
FIG. 13~FIG. 13C are respectively the sectional view and the exploded sectional view and top view before chips stacked of an embodiment of a chip stack having a protection structure for semiconductor device package of the present invention.
Figure 13A:
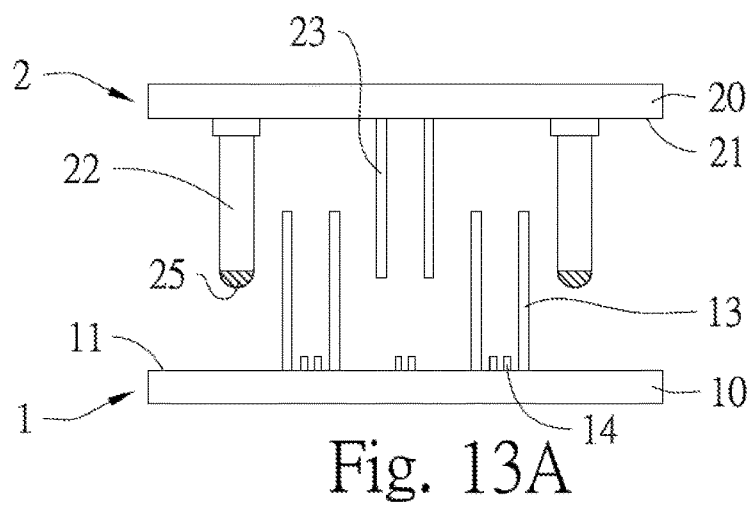
Figure 13B:
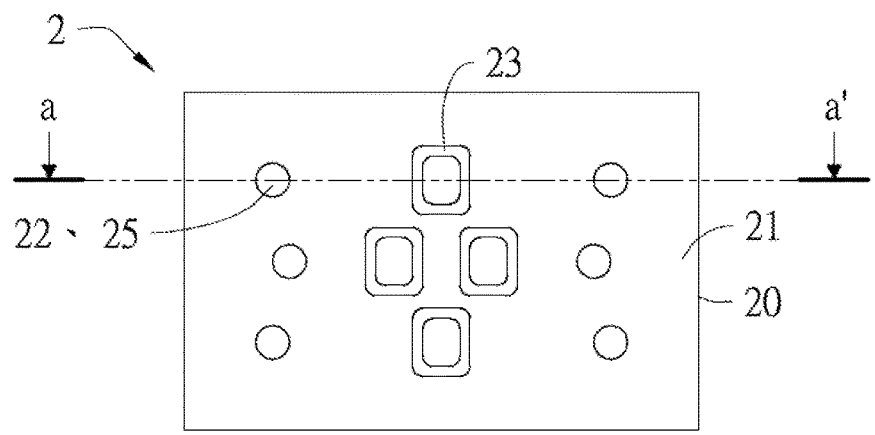
Figure 13C:
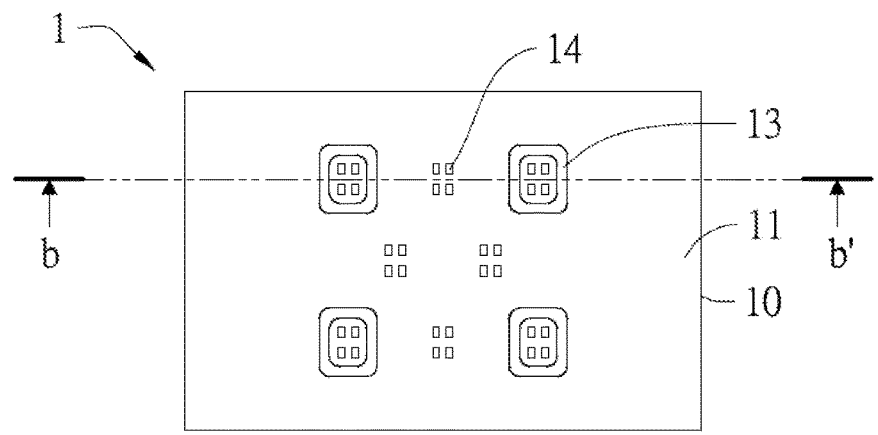

Please refer to FIG. 13~FIG. 13C, which are respectively the sectional view and the exploded sectional view and top view before chips stacked of an embodiment of a chip stack having a protection structure for semiconductor device package of the present invention. The main structure is mostly similar to the structure of the embodiment shown in FIG. 7~FIG. 7B, except that the protection rings 13 and the protection rings 23 are formed respectively on the first surface 11 of the first chip 1 and the second surface 21 of the second chip 2, and only the electrical devices 14 are formed on the first surface 11 of the first chip 1 but there is no electrical device 24 formed on the second surface 21 of the second chip 2. In this embodiment, the protection ring 13 and the protection ring 23 are not vertically aligned with each other, which mean that the projection of the protection ring 13 does not overlap with the projection of the protection ring 23. The electrical devices 14 of the eight small areas are located respectively inside the four protection rings 13 of the first chip 1 and the four protection rings 23 of the second chip 2.

Figure 14:
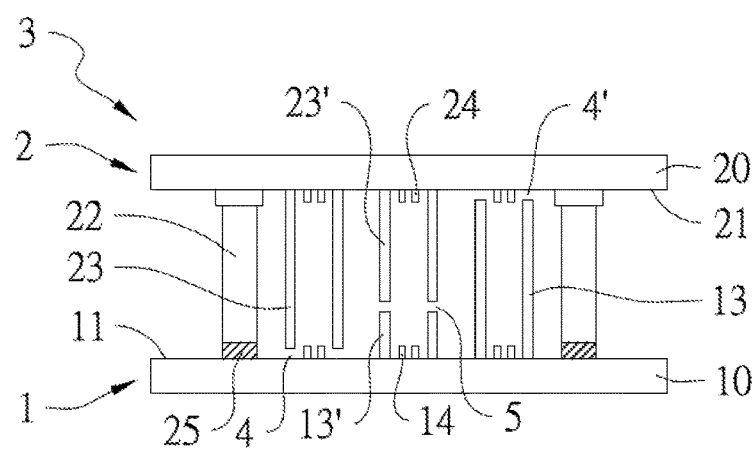
FIG. 14~FIG. 14C are respectively the sectional view and the exploded sectional view and top view before chips stacked of an embodiment of a chip stack having a protection structure for semiconductor device package of the present invention.
Figure 14A:
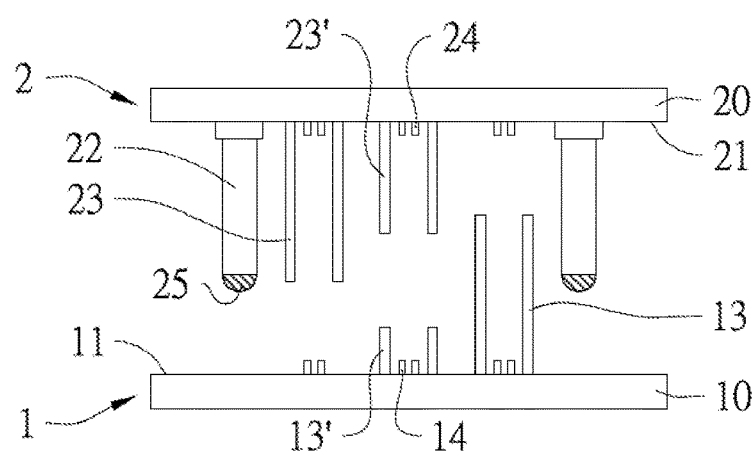
Figure 14B:
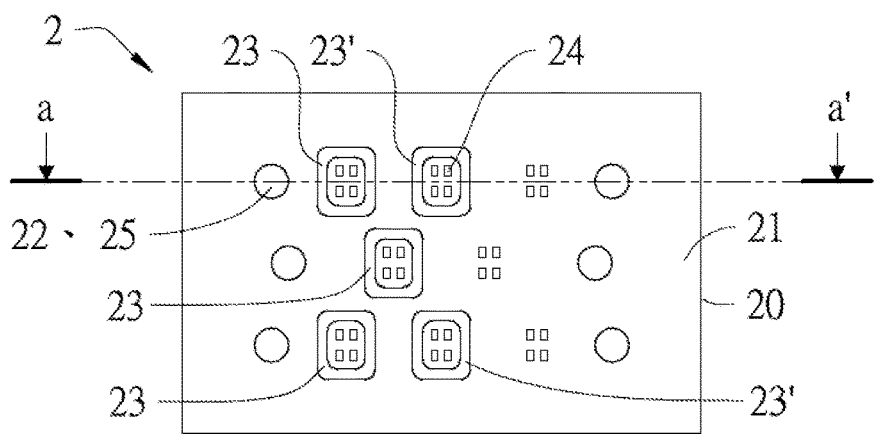
Figure 14C:
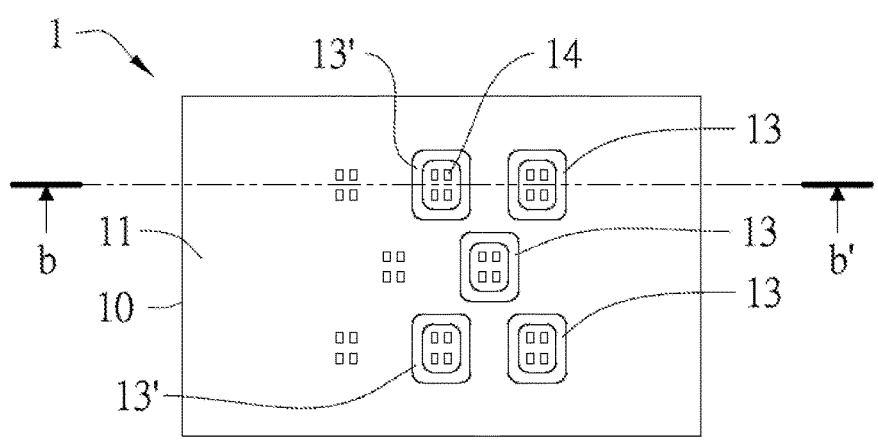
Figure 15:
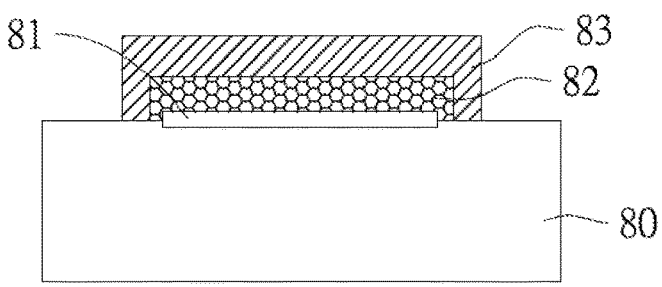
FIG. 15~FIG. 15C are the production process sectional view of an embodiment of the conventional technique.
Figure 15A:
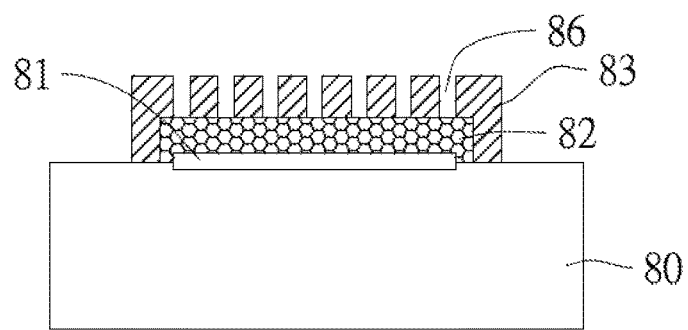
Figure 15B:
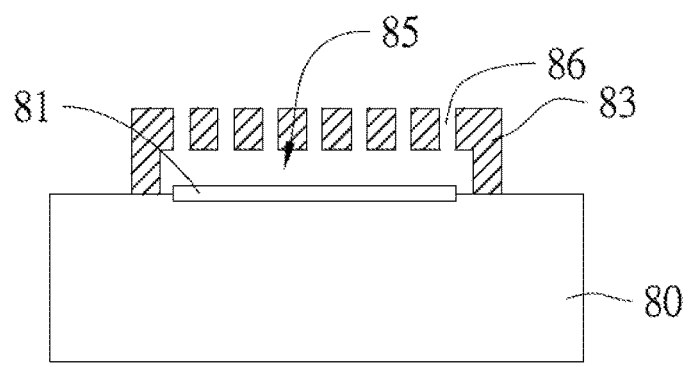
Figure 15C:
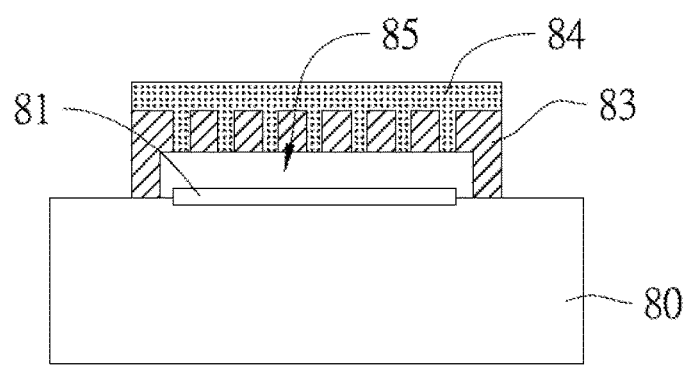

Please refer to FIG. 14~FIG. 14C, which are respectively the sectional view and the exploded sectional view and top view before chips stacked of an embodiment of a chip stack having a protection structure for semiconductor device package of the present invention. The main structure is mostly similar to the structure of the embodiment shown in FIG. 1~FIG. 12C, except that the protection rings 13 and the protection rings 13' are formed on the first surface 11 of the first chip 1, and the protection rings 23 and the protection rings 23' are formed on the second surface 21 of the second chip 2. In this embodiment, the protection ring 13 and the protection ring 23 are not vertically aligned with each other, which mean that the projection of the protection ring 13 does not overlap with the projection of the protection ring 23. While the protection ring 13' and the protection ring 23' are vertically aligned with each other, which mean that at least part of the projection of the protection ring 13' overlaps with the projection of the protection ring 23'. A second gap 5 exists between the protection ring 13' of the first chip 1 and the protection ring 23' of the second chip 2. The second gap 5 has the same function as the first gap 4 mentioned the above. The width of the second gap 5 is greater than 1 μm and less than 30 μm.

As disclosed in the above description and attached drawings, the present invention can provide a chip stack having a protection structure for semiconductor device package. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A chip stack having a protection structure for semiconductor device package, which comprises:
a first chip and a second chip stacked with each other, wherein said first chip has a first surface, said second chip has a second surface, said first surface and said second surface are two surfaces facing to each other, wherein each of at least one metal pillar is formed on one of said first surface and said second surface and connected with the other one of said first surface and said second surface by a soldering metal layer which is coated on each of said at least one metal pillar; wherein a protection ring is formed on said second surface; wherein each of at least one electrical device is formed on said second surface and surrounded by said protection ring; wherein an inner space is defined by said protection ring, said first surface and said second surface; wherein a first gap is provided between said protection ring and said first surface so that said protection ring is not contacted with said first surface; wherein said first gap provides fluid communication between said inner space and the external atmosphere.

2. The chip stack having a protection structure for semiconductor device package according to claim 1, wherein a width of said first gap is greater than 1 μm and less than 30 μm.

3. The chip stack having a protection structure for semiconductor device package according to claim 1, wherein a height of said protection ring is greater than 1 μm and less than 100 μm.

4. The chip stack having a protection structure for semiconductor device package according to claim 1, wherein said protection ring is made of at least one material selected from the group consisting of Cu, Au, Sn, In, Au alloy, Cu alloy, Sn alloy and In alloy.

5. The chip stack having a protection structure for semiconductor device package according to claim 1, wherein said protection ring is made of at least one material selected from the group consisting of photosensitive material, photoresist, SU8 photoresist and acrylic material.

6. The chip stack having a protection structure for semiconductor device package according to claim 1, wherein a thickness of said protection ring is greater than 1 μm and less than 100 μm.

7. The chip stack having a protection structure for semiconductor device package according to claim 1, wherein said at least one electrical device including at least one of a surface acoustic wave device, a bulk acoustic wave device, a micro-electro-mechanical device and a gyroscope.

8. The chip stack having a protection structure for semiconductor device package according to claim 1, wherein the material of a substrate of said first chip is one material selected from the group consisting of $LiTaO_3$, $LiNbO_3$, quartz, Si, GaAs, GaP, sapphire, $Al_2O_3$, InP, SiC, diamond, GaN and AlN.

9. The chip stack having a protection structure for semiconductor device package according to claim 1, wherein the material of a substrate of said second chip is one material selected from the group consisting of $LiTaO_3$, $LiNbO_3$, quartz, Si, GaAs, GaP, sapphire, $Al_2O_3$, InP, SiC, diamond, GaN and AlN.

10. The chip stack having a protection structure for semiconductor device package according to claim 1, wherein said at least one metal pillar is made of at least one material selected from the group consisting of Cu, Au, Au alloy and Cu alloy.

11. The chip stack having a protection structure for semiconductor device package according to claim 1, wherein said soldering metal layer is made of at least one material selected from the group consisting of In, Sn, In alloy and Sn alloy.

12. The chip stack having a protection structure for semiconductor device package according to claim 1, wherein said first chip is stacked on said second chip or said second chip is stacked on said first chip.

13. The chip stack having a protection structure for semiconductor device package according to claim 1, wherein each of said at least one metal pillar is used for signal transferring between said first chip and said second chip.

* * * * *